United States Patent [19]
Luce

[11] 3,943,456
[45] Mar. 9, 1976

[54] SIGNAL GENERATOR FOR ELECTRONIC MUSICAL INSTRUMENT, EMPLOYING VARIABLE RATE INTEGRATOR

[75] Inventor: David A. Luce, Clarence Center, N.Y.

[73] Assignee: Moog Music, Inc., Williamsville, N.Y.

[22] Filed: June 14, 1974

[21] Appl. No.: 479,486

[52] U.S. Cl. ................. 328/185; 84/1.01; 307/228; 307/229; 328/127

[51] Int. Cl.$^2$... G10H 1/00; H03K 4/10; G06G 7/18

[58] Field of Search ........... 307/228, 229, 260, 263, 307/271; 328/127, 128, 185, 59; 84/1.01

[56] References Cited

UNITED STATES PATENTS

| | | | |
|---|---|---|---|
| 3,350,651 | 10/1967 | Davis | 328/127 |
| 3,364,366 | 1/1968 | Dryden | 328/185 |
| 3,440,448 | 4/1969 | Dudley | 307/271 |
| 3,482,116 | 12/1969 | James | 328/127 |
| 3,493,961 | 2/1970 | Hansen | 328/185 |
| 3,714,470 | 1/1973 | Goldberg | 307/229 |
| 3,745,373 | 7/1973 | Jones et al. | 307/228 |
| 3,757,099 | 9/1973 | Anderson | 307/229 |
| 3,835,402 | 9/1974 | Kublick | 307/228 |

*Primary Examiner*—Stanley D. Miller, Jr.
*Attorney, Agent, or Firm*—Hill, Gross, Simpson, Van Santen, Steadman, Chiara & Simpson

[57] ABSTRACT

An electronic musical instrument incorporates apparatus for producing, on either a triggered or a repetitive basis, a wave form which is employed to produce a variety of musical sounds upon being connected to a loudspeaker. The generator is provided with means for independently modifying the wave shape and frequency of a repetitive signal, each without changing the other.

11 Claims, 4 Drawing Figures

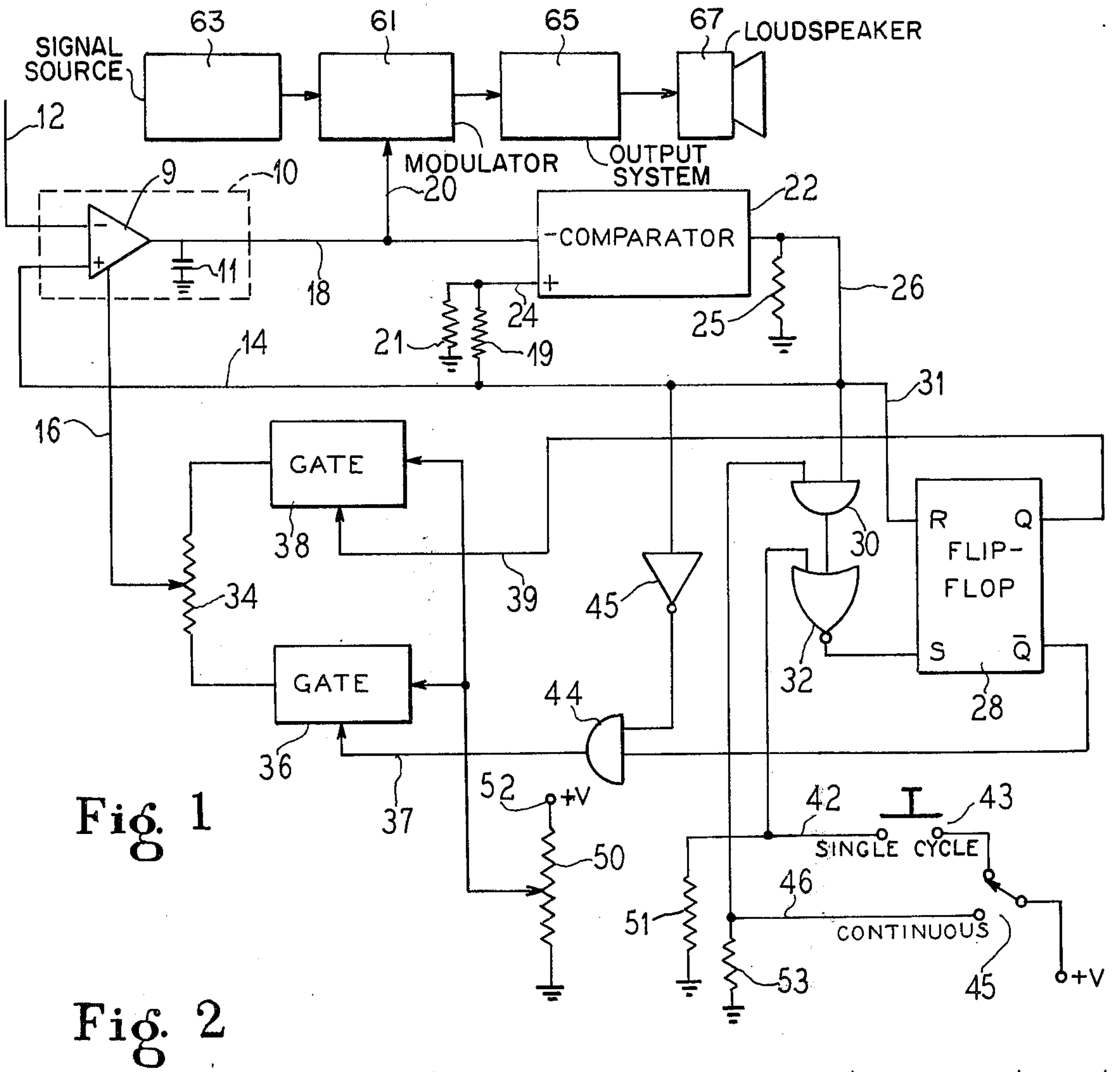
Fig. 1
Fig. 2
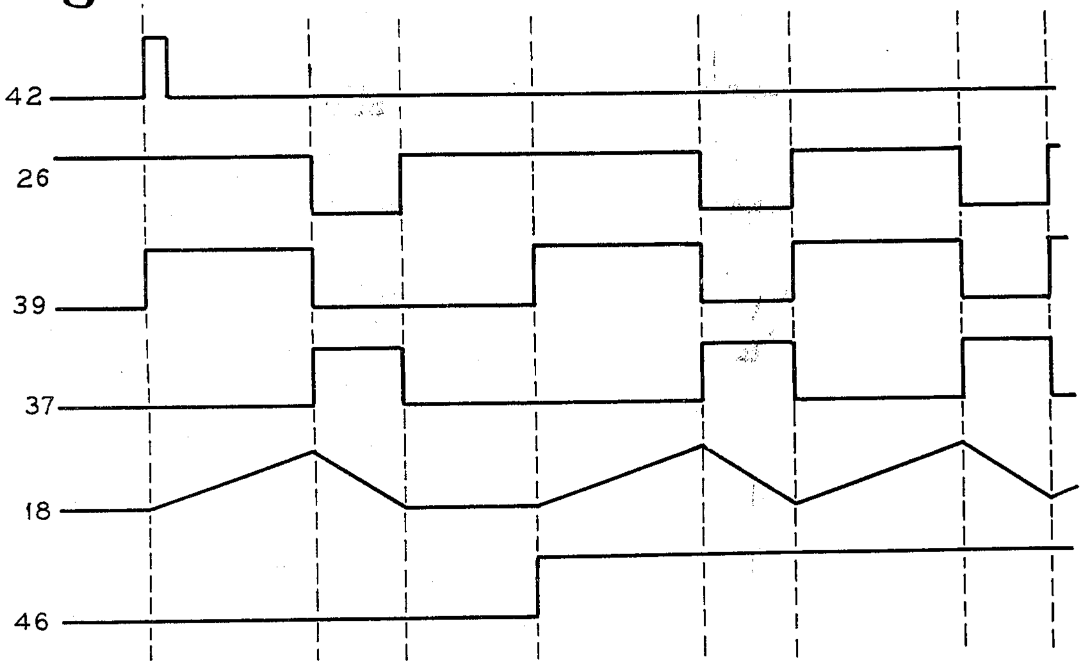

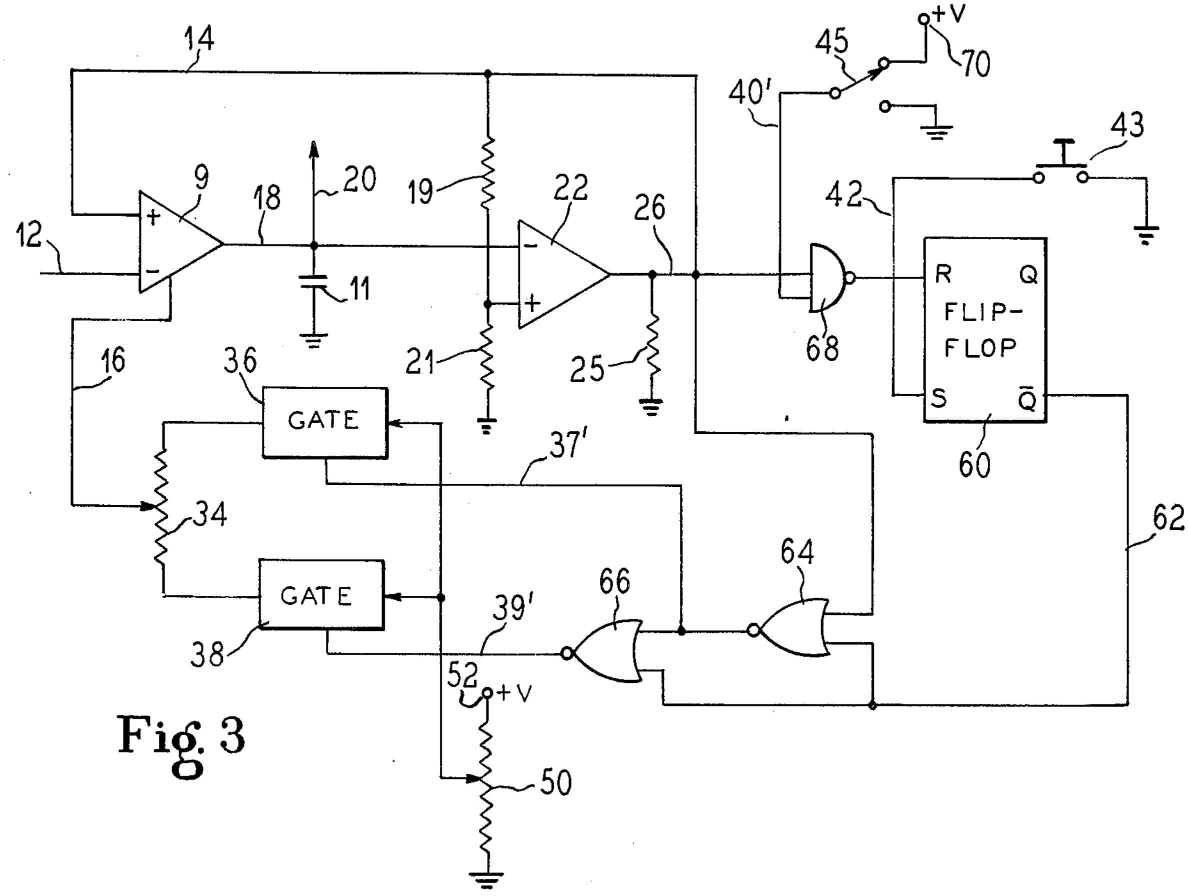
Fig. 3
Fig. 4
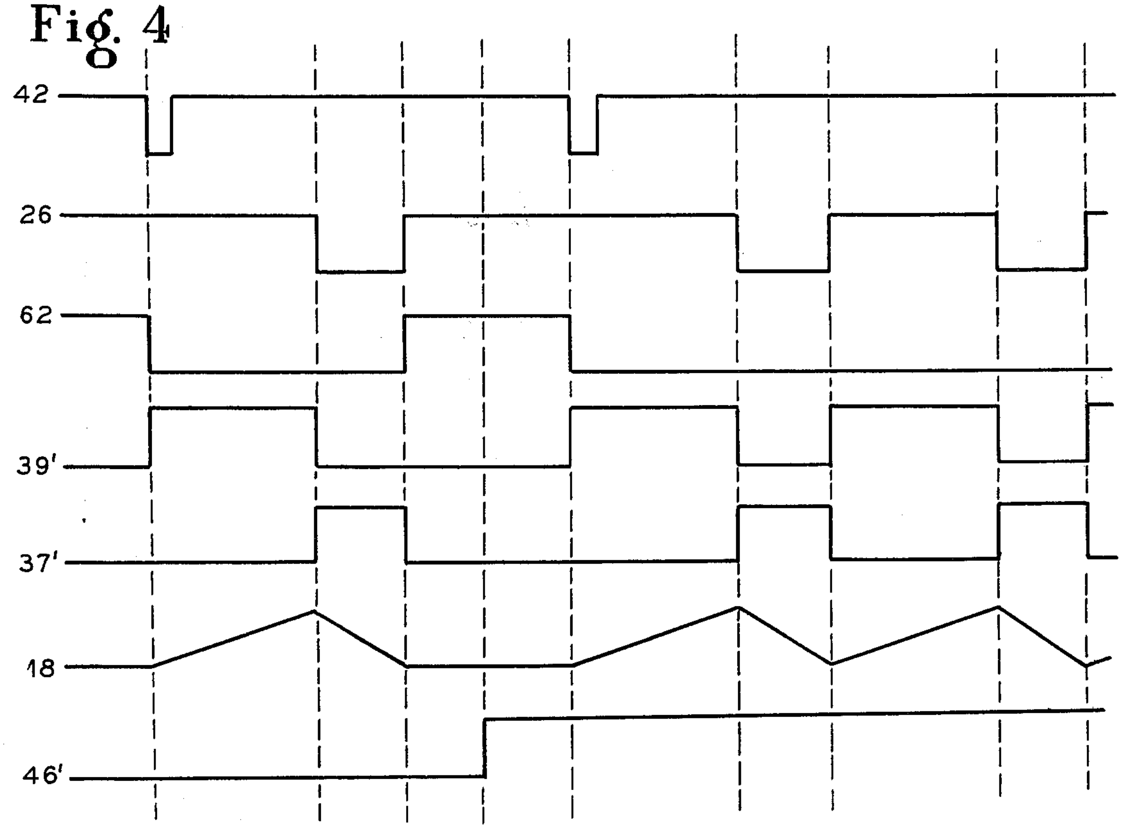

SIGNAL GENERATOR FOR ELECTRONIC MUSICAL INSTRUMENT, EMPLOYING VARIABLE RATE INTEGRATOR

BACKGROUND

1. Field of the Invention

The present invention relates to electronic musical instruments, and more particularly to electronic synthesizers, in which a signal of desired amplitude and wave shape is produced under the control of a variety of manual controls. Such a signal must be produced either repetitively or when triggered by a control signal.

2. The Prior Art

In known designs for synthesizer instruments, the wave shape produced by the sound source is typically either a sine wave or a square wave. Both of these wave shapes are relatively easy to generate, and they may be transformed from one to the other without difficulty. Other wave shapes may be derived from them, with the result that a variety of wave shapes may be obtained simply by manipulation of sign and square waves.

Although such fundamental wave shapes can be used with great success, it is desirable to provide apparatus for making a greater variety of wave shapes available, with the use of a limited number of controls which may be adjusted by the operator or player of the instrument. In particular, it is desirable to have one control for varying the wave shape of a signal produced by the apparatus, without any effect on the frequency of the signal, and another control for varying the frequency of the signal without having any effect on its wave shape.

SUMMARY OF THE PRESENT INVENTION

It is therefore a principal object of the present invention to provide a signal generator for producing a signal which may be controlled both in frequency and wave shape, independently, with only two controls, each of such controls controlling only one of the parameters without affecting the other.

It is another object of the present invention to provide a signal generator which produces a triangular wave form in which the output level increases linearly from a first level to a second level, and then declines linearly from the second level to the first level, with the slopes of both linear portions being adjustable.

A further object of the present invention is to produce a signal generator adapted for creating triangular wave forms in which the frequency of the triangular wave form is variable without affecting the wave shape of the output.

Another object of the present invention is to provide such a signal generator which is capable of being operated to produce a continuous series of cycles having a predetermined wave shape or a single such cycle triggered by a control signal.

These and other objects and advantages of the present invention will become manifest upon a review of the following description and the accompanying drawings.

In accordance with one embodiment of the present invention there is provided a current switching amplifier with means for integrating a constant level input at a first rate during a first portion of each cycle, and for integrating such constant level input at a second rate during a second portion of the cycle, with means for estblishing a fixed relationship between the first and second rates.

BRIEF DESCRIPTION OF THE DRAWINGS

Reference will now be made to the accompanying drawings, in which:

FIGS. 1 and 3 are functional block diagrams of alternative embodiments of the present invention; and FIGS. 2 and 4 illustrate certain wave forms produced in the opertion of the apparatus of FIGS. 1 and 3.

DESCRIPTION OF THE PREFERRED EMBODIMENTS

Referring now to FIG. 1, a system is shown which is adapted for the production of triangular waves of variable shape and frequency. An operational amplifier 10 has its non-inverting input connected to an input line 12 and its inverting input connected to a second line 14. A constant potential is applied to the line 12, but the potential applied to the line 14 is variable, as described in more detail hereinafter. The function of the integrator 10, which includes an operational transconductance amplifier or OTA 9 and a capacitor 11, is to integrate the difference between the signals on the lines 12 and 14 at a rate dependent upon a bias current applied to a control input line 16. The result, on an output line 18, is an increasing wave form which increases linearly from a first potential until a second potential is reached. An output line 20 connects the line 18 with a utilization device.

The line 18 is connected to one input of a comparator unit 22, the other input of which is connected to a line 24. A resistor 25 is provided as a load resistor for the comparator. The output of the comparator, which is produced on line 26, is bi-stable in nature, assuming one potential or the other, in dependence upon whether or not the potentials on the two lines 18 and 24 are equal. The line 24 is connected to the line 26 by means of a voltage divider including resistors 19 and 21, to give a hysteresis to the operation of the comparator 22. The line 26 is connected to the line 14, to furnish a positive feedback for the integrator unit 10, so that the function of the integrator 10 is to integrate the input in a direction which causes the level on the output line 18 to approach the potential on the line 24. As soon as that potential is reached, the output of the comparator 22 changes its state, changing the level of input applied to the line 14, and causing the integrator to integrate in the opposite direction. The OTA 9 functions as a current switching amplifier, alternately supplying current to the capacitor 11 and drawing current from it, in proportion to the bias current supplied over the line 16.

The current supplied over the line 16 is determined by the setting of the potentiometer 34. The tap of the potentiometer 34 is connected to the line 16, and the two end terminals of the potentiometer 34 are connected to outputs of two analog gates 36 and 38. One input of each of the gates 36 and 38 is derived from a potentiometer 50, connected between a source of positive potential at a terminal 52 and ground, and the other input of each of the gates is individually connected to the two outputs Q and Q of an R-S flip-flop 28. The flip-flop 28 is caused to assume different ones of its two stable states on alternate half cycles of the signal produced on the line 26.

Only one of the gates 36 or 38 is enabled, in accordance with the state of the flip-flop 28. When the gate 36 is enabled, the potential on the line 16 is dependent upon the amount of resistance in the circuit between the tap of the potentiometer 34 and the output of the gate 36. Similarly, the potential on the line 16 when the gate 38 is enabled is dependent on the resistance between the tap of the potentiometer 34 and the output of the gate 38. The time constant of the integration of the integrator 10 in each case is proportional to the resistance in the circuit, which determines the slope of the wave form produced on the line 18 during each half cycle. The total cycle time (one integration in each direction) is proportional to the sum of the time constants of the circuits associated with the two gates 36 and 38, it follows that the time constant is proportional to the total resistance of the potentiometer 34. As the total resistance does not vary, it is apparent that the slopes of the increasing and decreasing portions of the wave form are varied independently without changing the frequency of the output signal. An increase in slope of the rising portion is accompanied by a decrease in the slope of the falling portion, to maintain the same frequency.

The frequency is adjusted by changing the position of the tap of the potentiometer 50, connected between a source of positive potential at a terminal 52 and ground. In this way, the potential applied to an input of each of the gates 36 and 38 is varied, causing a corresponding variation in the output voltages of the gates. The voltage levels applied to the gates from the flip-flop 28 are bi-stable and fixed, so that only the potential applied to the gates from the potentiometer 50 and the total resistance of the potentiometer 34 affect the frequency of the output signal.

The R or reset input of the flip-flop 28 is connected directly to the line 26, so that the flip-flop 28 is reset at the beginning of each negative-going half cycle of the signal on the line 26. A pair of gates 30 and 32 are included in the circuit for rendering the operation of the apparatus shown in the drawing either continuous or intermittent in response to a control or trigger signal. The gate 30 is an AND gate having one input connected to the line 26 and the other connected to a control line 46. The gate 32 is a NOR gate and has one input connected to the output of the gate 30 and the other connected to a trigger line 42. Resistors 51 and 53 connect the lines 42 and 46 to ground. The trigger line 42 is normally held at a low level and is energized with a positive-going pulse to trigger each cycle when an intermittent mode of operation is desired, so that one cycle of operation is permitted, beginning with the setting of the flip-flop 28. The integration which follows ends with the production of a low level signal on the line 26, which resets the flip-flop 28 and begins the second integration, ending with the production of a high level signal on the line 26. If the gate 30 is enabled, by a high signal on the line 46, the output of the gate goes high, producing a low signal at the output of the gate 32 which sets the flip-flop 28 and precipitates another cycle of operation. This continues as long as the line 46 is high. If the line 46 is low, only one cycle is produced in response to a pulse on the line 42. Of course, continuous operation may be initiated by a high signal on the line 42 without a pulse on the line 46.

A second gate 44 is interconnected between the Q output of the flip-flop 28 and the input of the gate 36. One input of the gate 44 is connected to the Q output, and the other input is connected to the line 26 through an inverter 45. When the Q output is high, during the second integration period, the level on the line 26 is low, so the output of the inverter 45 is high and the gate 44 is enabled to perform as described above. After the operation ceases, however, when the lines 42 and 46 are both low, the gate 44 is disabled, and so both of the gates 34 and 36 are also disabled and the integrator 10 is not functional until one of the lines 42 and 46 goes high to initiate operation again.

The utilization device connected to the line 20 is preferably a modulator 61 interconnected between an a.c. signal source 63 and an output system 65 including a loudspeaker 67 adapted to produce sound waves corresponding to the a.c. signal, with an amplitude proportional to the voltage level on the output line 20. These sound waves form a packet of sound waves of a controlled duration, having controlled rates of increase and decrease of loudness, in accordance with the state of the various controls described above. A single such packet is produced when the line 42 is pulsed, and a continuous series of such packets is produced when the line 46 is at a high potential. When the operation is continuous, the apparatus of the present invention functions as an oscillator, and when the operation is intermittent, it functions like a contour generator, to control the wave shape and duration of the packet. It is apparent that the apparatus of the present invention may be used in other applications as well, wherever an oscillator having a controllable wave shape or a contour generator is desired.

The components of FIG. 1 are standard components which are commercially available. In a preferred form of the invention, the OTA 9 is an RCA model 3080 integrated circuit, and the comparator 22 is also a model 3080 integrated circuit. The various gates are standard CMOS series units, and the flip-flop 28 is a pair of cross-coupled NAND gates.

Referring now to FIG. 3, an alternative arrangement of the present invention is illustrated, in which the same reference numerals have been applied to corresponding components. The comparator 22 is shown in the form of an OTA. The apparatus of FIG. 3 functions in a slightly different manner from that described above in relation to FIG. 1. A flip-flop 60 is provided which functions as a start-stop flip-flop. It is normally in its reset state, but is set by operation of a push button switch 43 whenever operation is to begin. Single cycle or continuous operation is selected by means of a selector switch 45. As soon as the flip-flop 60 becomes set, the potential at its Q output goes low. The Q output of the flip-flop 60 is connected by means of a line 62 to one input of each of two NOR gates 64 and 66. Another input of the NOR gate 66 is connected to the NOR gate 64. The two NOR gates 64 and 66 both function as inverters when the potential on the line 62 is low. When the potential on the line 62 is high, however, as it is when the flip-flop 60 is in its reset state, the outputs of both gates 64 and 66 are held at near ground potential and the two gates 36 and 38 are held off. The output of the gate 64 is connected to the control input of the analog gate 36, and the output of the NOR gate 66 is connected to the control of the analog gate 38. Thus, as long as the line 62 is low, one or the other of the two gates 36 and 38 is energized. The second input of the NOR gate 64 is connected to the output of the comparator 22, which changes from a high level to a low level after the first half-cycle of the waveform. This causes the output of the gate 66 to go high to energize the gate 38 via line 39', while the output of the gate 64 goes low to disable the gate 36. In this way, the gate 38 is operative during the second half-cycle of the waveform, and the gate 36 is disabled.

As long as the gate 68 is connected to the source of positive potential at the terminal 70, as shown, this potential is connected to the gate 68 over the line 40′, and when the line 26 goes high at the end of the second half-cycle, the output of the gate 68 goes low to reset the flip-flop 60. This provides single cycle capability.

When the switch 45 is in its other condition, however, a ground potential is connected to the input of the gate 68, so that the gate 68 is held disabled and the flip-flop 60 remains in its set state to permit continuous operation.

The operation of FIG. 3 differs somewhat from that of FIG. 1 in that the push button switch 43 must be depressed to initiate operation in either mode in the apparatus of FIG. 3, whereas either the push button or the switch 45 initiates operation of the apparatus of FIG. 1.

Waveforms illustrating the operation of the embodiments of FIGS. 1 and 3 are shown in FIGS. 2 and 4, respectively, both for single cycle operation and for continuous operation. As is apparent from these waveforms, the shape of the output waveform available on the line 18 is identical, whether single cycle or continuous operation is chosen.

As long as the setting of the potetiometer 50 remains unchanged, the period of the waveform remains constant, with the slope of the rising and falling portions of the waveform being adjustable by means of the potentiometer 34. Adjustment of the potentiometer 50 changes the period of the waveform without changing the relative durations of the rising and falling portions thereof.

It is apparent from the foregoing that the present invention provides apparatus by which the shape and period of a waveform may be selectively modified, without influencing the other, and which may be controlled for single cycle or continuous operation. It will be apparent to those skilled in the art that various modifications and additions may be made without departing from the essential features of novelty, which are intended to be defined and secured by the appended claims.

One such modification, for example, is the replacement of the integrator circuit 10 with a conventional voltage integrator circuit, using a differential amplifier and capacitor. In this event, the line 14 is open circuited, with the non-inverting input of the differential amplifier being connected to ground. The line 16 is connected to the inverting input of the differential amplifier, and equal and opposite potentials are applied thereto through the gates 36 and 38 and the potentiometer 34. For this purpose, the input of one of the gates 36 and 38 is connected directly to the tap of the potentiometer 50 and the other is connected thereto through an inverting amplifier serving to provide an equal and opposite voltage to that present at the tap of the potentiometer 50. The output voltage on the line 18 is the time integral of the differential input voltage.

What is claimed is:

1. A signal generator comprising integrator means, comparator means connected to said integrator means and responsive thereto for producing two discrete output voltage levels on a single output line in response to a comparison of the output of said integrator means with a certain value, and connecting means connecting said line to said integrator for controlling the sign of the rate of change of the output of said integrator.

2. Apparatus according to claim 1, including control means for causing said integrator means to integrate at two different rates, in response to which of said two output voltage levels is being produced by said integrator at any given time.

3. Apparatus according to claim 1, wherein said connecting means controls the sign of integration of said integrator means oppositely for said two output voltage levels, said sign being always such as to cause the output of said integrator means to tend to approach the output voltage level of said comparator means.

4. Apparatus according to claim 3, including means for causing said integrator means and said comparator means to operate continuously, whereby a triangular waveform is produced at the output of said integrator means, each cycle of said waveform having two different slopes under the control of said control means.

5. Apparatus according to claim 1, including means for selectively disabling said integrator means.

6. Apparatus according to claim 1, wherein said integrator means comprises an operational transconductance amplifier.

7. For use in an electronic musical instrument, a signal generator for generating a single cycle of a triangular waveform, comprising integrator means, comparator means connected to said integrator means and responsive thereto for producing two discrete output voltage levels in response to a comparison of the output of said integrator means with a certain value, means connected to said integrator means and operative to control the sign of integration of said integrator means, said sign of integration being opposite for two successive integration periods, and means for discontinuing operation of said integrator means after a single cycle of operation including two successive integration periods.

8. For use in an electronic musical instrument, a signal generator comprising variable rate integrator means, means connected with said integrator for controlling the sign of integration of said integrator, said sign of integration being opposite for successive integration periods, a potentiometer, first connecting means for connecting a first end of said potentiometer to a source of reference potential, second connecting means for connecting a second end of said potentiometer to said reference potential, means for connecting the tap of said potentiometer to said integrator for supplying a signal to said integrator means for controlling the rate of integration thereof, and means for operating said first and second connecting means one at a time during successive periods of operation of said integrator.

9. Apparatus according to claim 8, wherein said last named means comprises a bi-stable device connected with said comparator means and operative to energize said first and second means selectively in response to the output voltage of said comparator.

10. Apparatus according to claim 8, including manually adjustable means for controlling the scale of the time rate of change of the output of said integrator means, whereby the period of the waveform produced at the output of said integrator may be controlled without affecting the wave shape of said waveform.

11. Apparatus according to claim 8, wherein said last named means comprises a pair of inverters connected in series with the output of said comparator, means connecting the output of one inverter to energize said first circuit means, and means connecting the output of the other inverter to energize said second circuit means.

* * * * *